(12) United States Patent
Darwish et al.

(10) Patent No.: US 11,316,021 B2
(45) Date of Patent: Apr. 26, 2022

(54) HIGH DENSITY POWER DEVICE WITH SELECTIVELY SHIELDED RECESSED FIELD PLATE

(71) Applicant: MaxPower Semiconductor Inc., San Jose, CA (US)

(72) Inventors: Mohamed N. Darwish, Campbell, CA (US); Jun Zeng, Torrance, CA (US); Richard A. Blanchard, Los Altos, CA (US)

(73) Assignee: MaxPower Semiconductor Inc., San Jose, CA (US)

( * ) Notice: Subject to any disclaimer, the term of this patent is extended or adjusted under 35 U.S.C. 154(b) by 0 days.

(21) Appl. No.: 16/991,935

(22) Filed: Aug. 12, 2020

(65) Prior Publication Data

US 2021/0083061 A1 Mar. 18, 2021

Related U.S. Application Data

(60) Provisional application No. 62/885,708, filed on Aug. 12, 2019, provisional application No. 63/038,571, filed on Jun. 12, 2020.

(51) Int. Cl.
| | |
|---|---|
| *H01L 29/40* | (2006.01) |
| *H01L 29/423* | (2006.01) |
| *H01L 29/66* | (2006.01) |
| *H01L 29/739* | (2006.01) |
| *H01L 29/78* | (2006.01) |
| *H01L 29/06* | (2006.01) |

(52) U.S. Cl.
CPC ........ *H01L 29/407* (2013.01); *H01L 29/0634* (2013.01); *H01L 29/401* (2013.01); *H01L 29/404* (2013.01); *H01L 29/4236* (2013.01); *H01L 29/66348* (2013.01); *H01L 29/66734* (2013.01); *H01L 29/7397* (2013.01); *H01L 29/7813* (2013.01)

(58) Field of Classification Search
CPC . H01L 29/407; H01L 29/404; H01L 29/4236; H01L 29/66348; H01L 29/66734; H01L 29/7397; H01L 29/7813; H01L 29/0634
See application file for complete search history.

(56) References Cited

U.S. PATENT DOCUMENTS

| | | | |
|---|---|---|---|
| 8,076,719 B2 | 12/2011 | Zeng et al. | |
| 8,680,607 B2 | 3/2014 | Zeng et al. | |
| 2009/0061585 A1* | 3/2009 | Banerjee | H01L 29/7802 438/270 |

(Continued)

OTHER PUBLICATIONS

Wang, Hao, "Power MOSFETs with Enhanced Electrical Characteristics," Department of Materials Science and Engineering, 2009, pp. 13. (Year: 2009).*

(Continued)

*Primary Examiner* — Joseph C. Nicely
(74) *Attorney, Agent, or Firm* — Patent Law Group; Brian Ogonowsky

(57) ABSTRACT

A vertical transistor structure in which a recessed field plate trench surrounds multiple adjacent gate electrodes. Thus the specific on-state conductance is increased, since the ratio of recessed field plate area to channel area is reduced. Various versions use two, three, or more distinct gate electrodes within the interior of a single RFP or RSFP trench's layout.

17 Claims, 20 Drawing Sheets

(56) References Cited

U.S. PATENT DOCUMENTS

| | | | |
|---|---|---|---|
| 2012/0043602 A1* | 2/2012 | Zeng | H01L 29/66727 |
| | | | 257/330 |
| 2014/0042535 A1* | 2/2014 | Darwish | H01L 29/407 |
| | | | 257/334 |
| 2016/0035882 A1* | 2/2016 | Vielemeyer | H01L 29/7813 |
| | | | 257/330 |
| 2017/0200822 A1* | 7/2017 | Li | H01L 29/407 |
| 2017/0213908 A1 | 7/2017 | Fursin et al. | |
| 2018/0366569 A1* | 12/2018 | Zeng | H01L 29/1095 |
| 2020/0335589 A1* | 10/2020 | Chen | H01L 29/66712 |
| 2020/0388702 A1* | 12/2020 | Hwang | H01L 29/086 |
| 2021/0057574 A1* | 2/2021 | Nishiwaki | H01L 29/66734 |

OTHER PUBLICATIONS

PCT/US2020/046007, "International Search Report and Written Opinion," dated Aug. 12, 2020, 12 pages.

\* cited by examiner

HIGH DENSITY POWER DEVICE WITH SELECTIVELY SHIELDED RECESSED FIELD PLATE

CROSS-REFERENCE

Priority is claimed from U.S. applications 62/885,708 filed Aug. 12, 2019, and 63/038,571 filed Jun. 12, 2020, both of which are hereby incorporated by reference.

BACKGROUND

The present application relates to power semiconductor devices which have majority carrier source regions near the surface of a semiconductor mass, and more particularly to power MOSFETs.

Note that the points discussed below may reflect the hindsight gained from the disclosed inventions, and are not necessarily admitted to be prior art.

Power MOSFETs are widely used as switching devices in many electronic applications. In order to minimize the conduction power loss it is desirable that power MOSFETs have a low specific on-resistance ($R_{SP}$ or R*A), which is defined as the product of the on-resistance of the MOSFET multiplied by the active die area. The most common way to reduce the $R_{sp}$ is to shrink the device's unit cell pitch (CP) to increase the packing density or number of cells per unit area. However, as the cell density increases, the associated intrinsic capacitances of the device, such as the gate-to-source capacitance (Cgs), the gate-to-drain capacitance (Cgd), the total input capacitance (Ciss), and the total output capacitance (Coss), also increase. Therefore for higher cell density devices the switching power loss of the device will increase.

Power MOSFET structures with Recessed Field Plates (RFPs) such as shown in FIG. 1(a), or with Recessed Shielded Field Plates (RSFPs) 141 such as shown in FIG. 1(b) and FIG. 1(c), provide lower Rsp and Cgd, i.e. lower total gate charge (Qg) and "Miller" charge (Qgd). (The RSFP has P-shield compensation regions 122 in addition to N-Enhancement regions.) See for example U.S. Pat. Nos. 8,076,719 and 8,659,076, which are hereby incorporated by reference. The RFP with P-shield structures provides a reduction in the depletion in the P-body region at reverse bias as well as improving the device reliability by reducing the electric field at the bottom of the gate trench. Use of a thick bottom oxide 124 as shown in FIG. 1(a), or of a split gate structure 126 as shown in FIG. 1(b), will reduce Qg and Qgd.

MOSFET structures having RFP trenches 140 and P-shield regions 122 provide several advantages. The total on-resistance Ron is determined as the sum of the on-resistance (Rch) of the channel plus the resistance Rdrift of the drift region. The trenched gate electrodes 130 create an active path for electric current conduction (causing Rch), while the N-drift layer and N+ substrate contribute to the Rdrift. Further reduction in Rsp is limited by the ability to increase cell/channel density or reducing CP. Reducing CP i.e. the spacing between P-shield regions results in pinching of the parasitic JFET formed by the P-shield regions (JFET gate) and the N-Enhancement (JFET channel). The JFET channel pinching results in an increase in Rdrift and a reduction in the current carrying capability (JFET saturation current) $I_{DSAT}$. It is therefore important to recognize that in the current RFP MOSFET structure there exists a limit on increasing cell density.

The present application teaches, among other innovations, a vertical device structure in which a recessed field plate trench (or a shielded recessed field plate trench or the like) surrounds multiple adjacent gate electrodes. Thus the specific on-state conductance is increased, since the ratio of field plate area to channel area is reduced. Various versions use two, three, or more distinguishable gate electrodes within the interior of a single RFP or RSFP trench's layout.

BRIEF DESCRIPTION OF THE DRAWINGS

The disclosed inventions will be described with reference to the accompanying drawings, which show important sample embodiments and which are incorporated in the specification hereof by reference, wherein.

DETAILED DESCRIPTION OF SAMPLE EMBODIMENTS

The numerous innovative teachings of the present application will be described with particular reference to presently preferred embodiments (by way of example, and not of limitation). The present application describes several inventions, and none of the statements below should be taken as limiting the claims generally.

In this application new Shielded RFP MOSFET devices using Selective Shielded Recessed Field Plate structure are disclosed. These new MOSFET structures achieve lower Rsp by using higher channel density per unit area, allowing high saturation current $I_{DSAT}$, while still maintaining the performance and reliability advantages of the RFP structures.

Figure 1A:
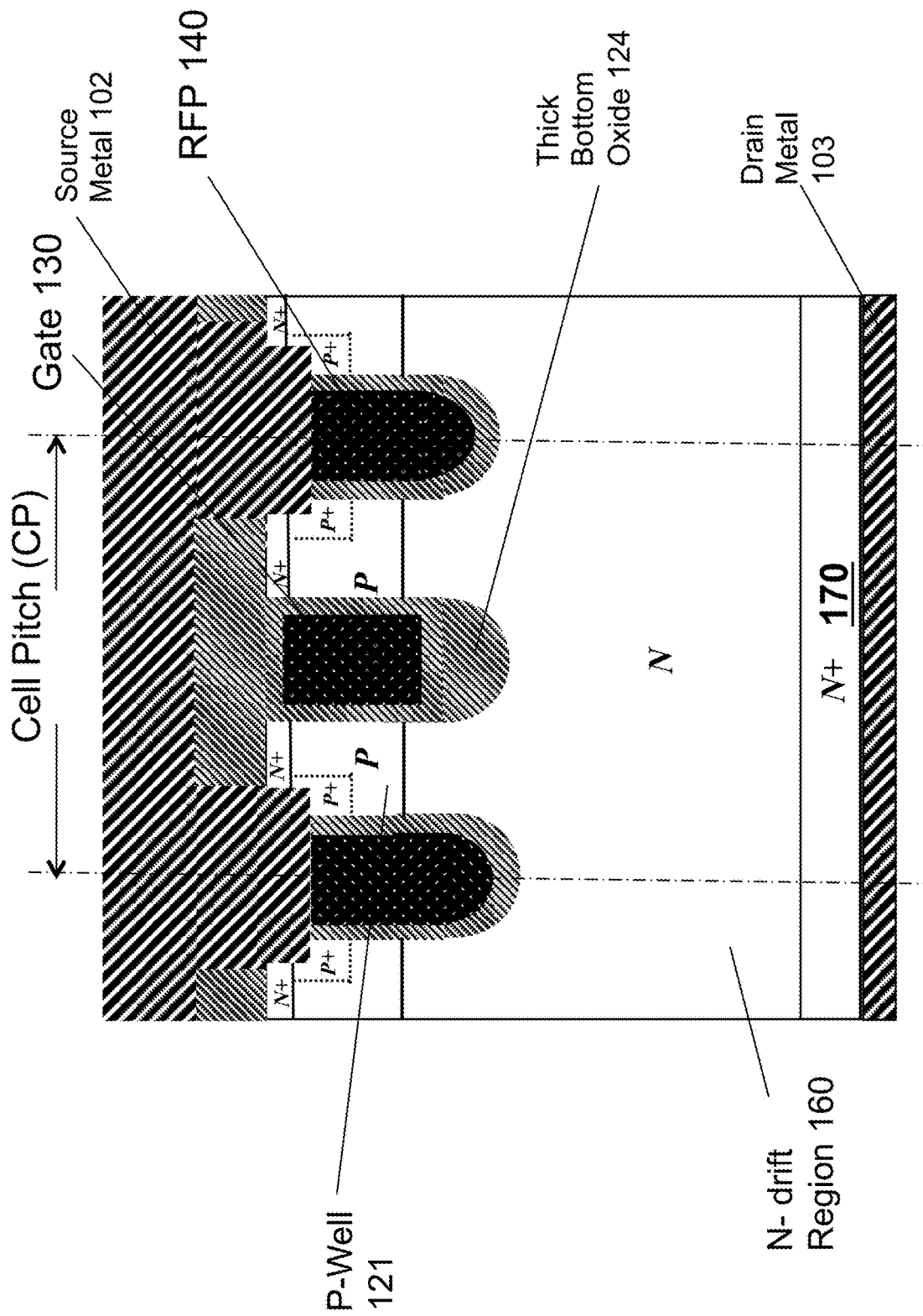
FIG. 1(a) shows an example of a previously proposed device structure with Recessed Field Plates (RFPs).
Figure 1B:
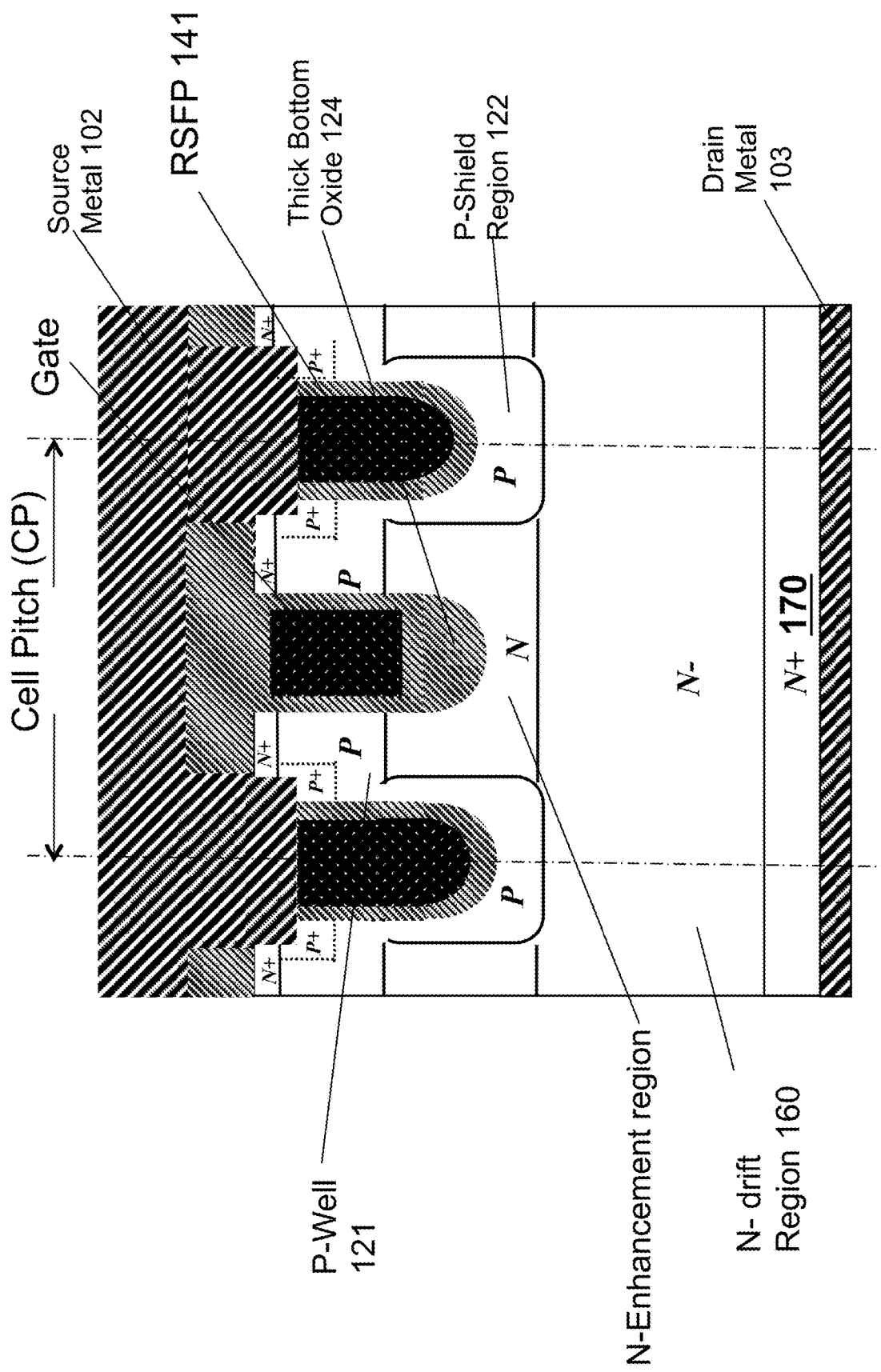
FIG. 1(b) and FIG. 1(c) show examples of previously proposed device structure with Recessed Shielded Field Plates (RSFPs).
Figure 1C:
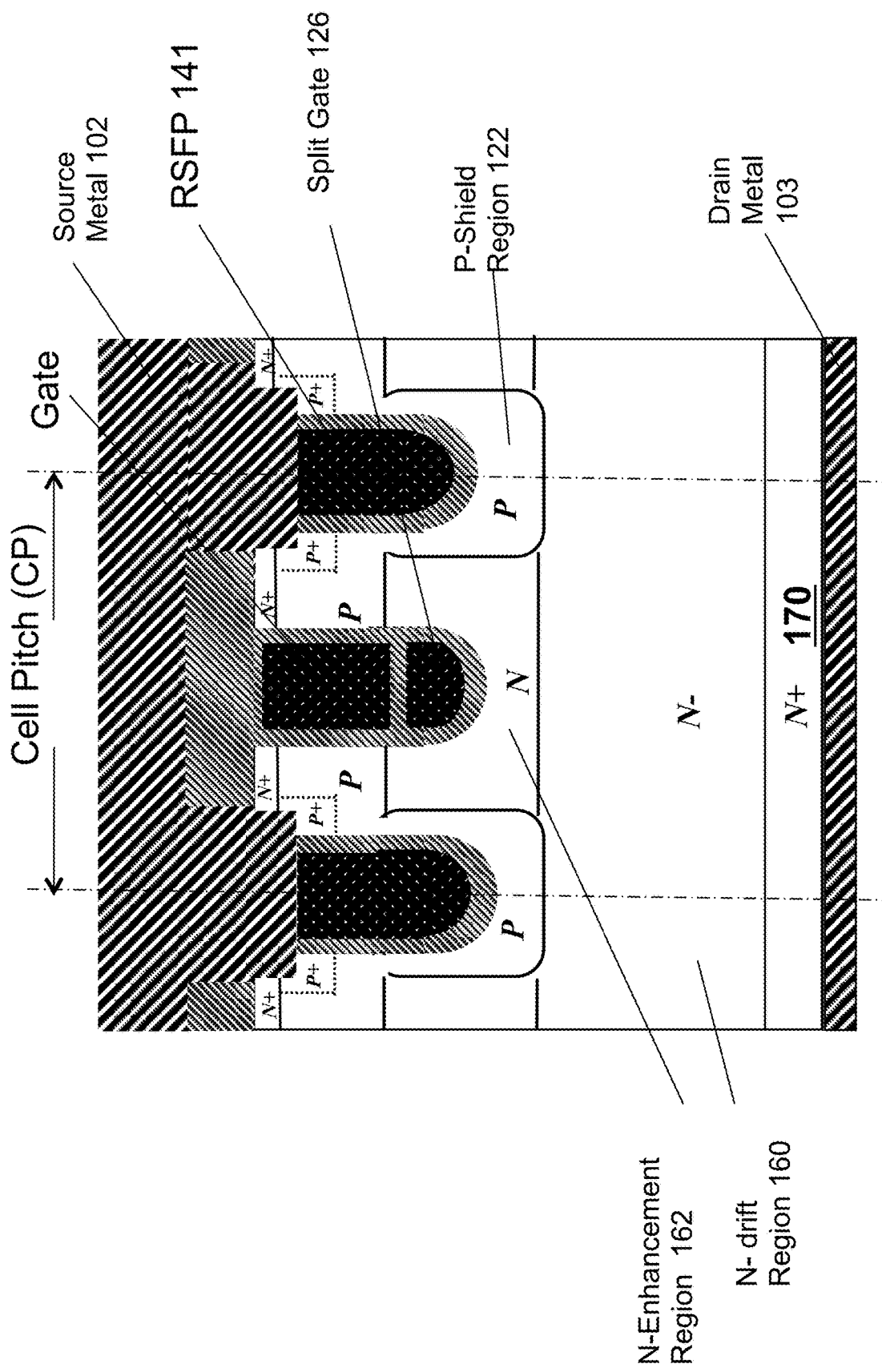
Figure 2:
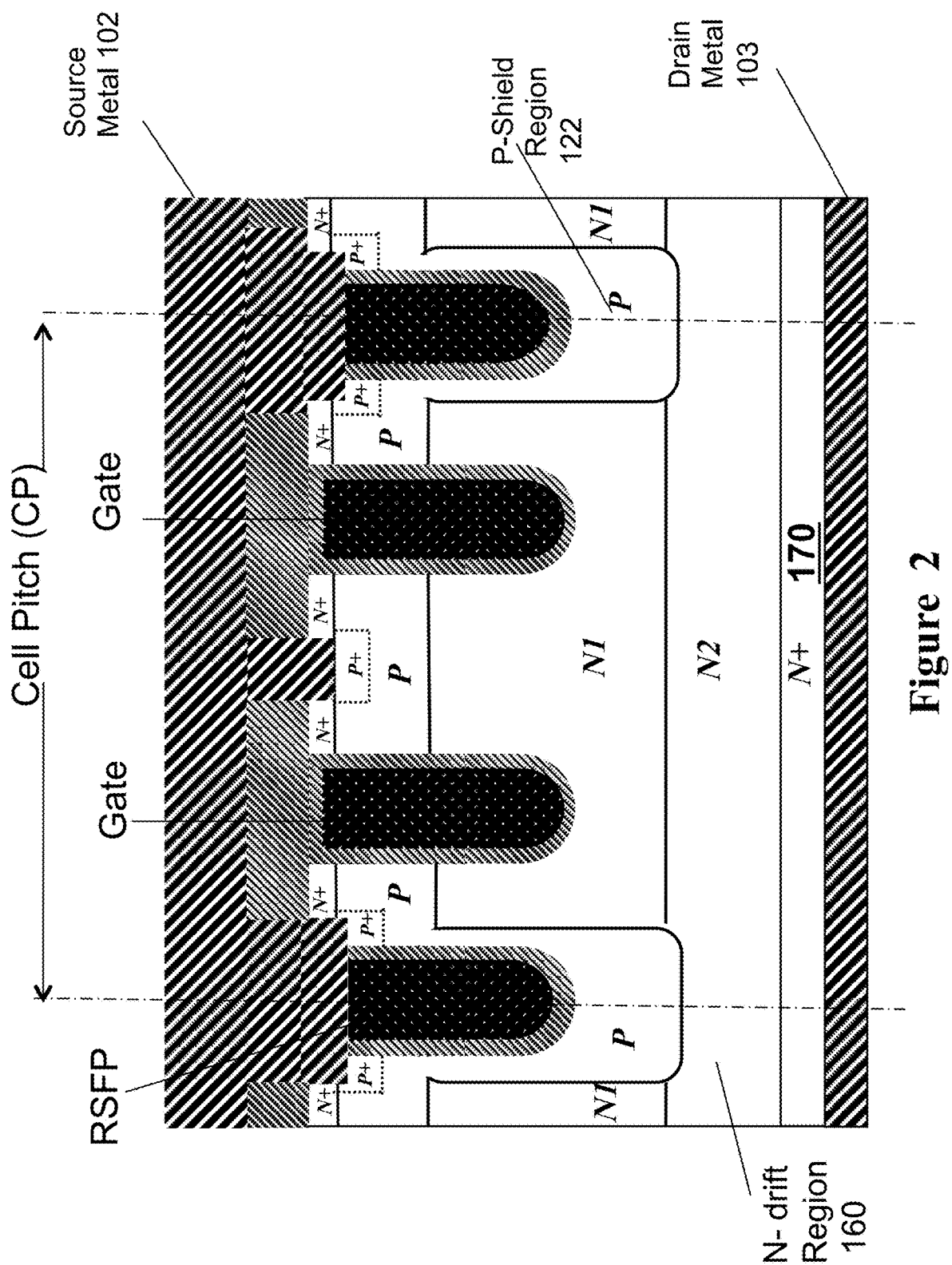
FIG. 2 shows an example of a n-channel MOSFET basic cell structure.

In one embodiment of this invention an n-channel MOSFET basic cell structure is shown in FIG. 2. The new structure cell has two gate electrodes and one RFP electrode. For the same active area, design rules and processing capabilities the ratio of gate trenches to RFP trenches is approximately doubled. Consequently the channel density per unit area of the new structure in FIG. 2 is higher. Furthermore, the N-drift region is composed of differently doped layers, e.g. an upper layer N1 and a lower layer N2. Depending on the required optimization (for the rated operating voltage), N1 can have a resistivity which is lower, higher, or the same as N2. Either of the N1 and/or N2 regions can be formed by implanting n-type dopant or by utilizing epitaxial layers grown over a heavily doped N+ substrate. Alternatively, the N1 and N2 layer can be replaced by a gradually varying doping profile. The doping gradient can be for example linear or other distribution. The RFP and gate trenches can be of substantially equal depth. The gate and RFP trench walls are lined with an insulating material such as silicon dioxide (SiO2). The gate and RFP electrodes are formed of conductive materials such as doped polysilicon. The RFP electrode is either independently biased or (more preferably) connected to the source electrode. It is important to note that the N-Enhancement doping separation between the P-Shield regions is designed to minimize Rdrift and increase the JFET saturation current.

Portions of the RFP trenches 140, the RSFP trenches 141, and the trenched gate electrode 130 are referred to as "distinguishable" if they are separate in cross-section, as illustrated here, even if they are electrically connected together. Note also that elements referred to as "distinguishable" do not have to differ from each other in any other way.

Figure 3:
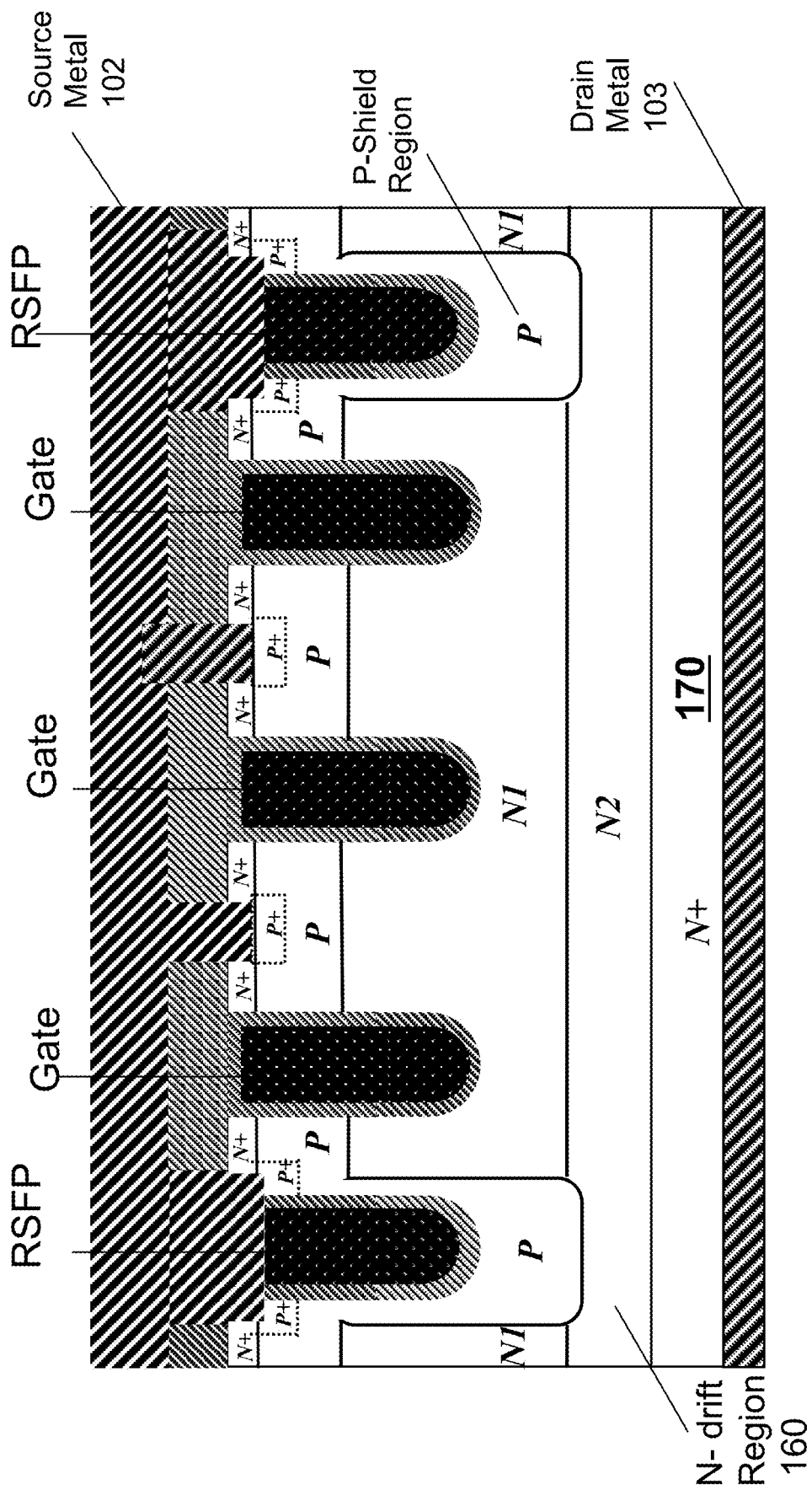
FIG. 3 shows another embodiment similar to that shown in FIG. 2 but with an additional third gate trench electrode.

FIG. 3 shows another embodiment which is generally somewhat similar to that shown in FIG. 2, but with an additional third gate trench electrode. Consequently the channel density per unit area of the new structure in FIG. 3 is higher than that of FIG. 2. This concept can be further extended to MOSFETs having a higher number of gate trenches than RFP trenches in each cell. Higher density RFP structures can be therefore realized by selectively using a lesser number and or location of RFP trenches. Such structures have the advantage to optimize the drain saturation current $I_{DSAT}$, with boundary conditions of: a minimum value of $I_{DSAT}$ (to meet application current capability requirements), and a maximum value of $I_{DSAT}$ (to meet requirements for current limiting under short circuit conditions). In such structures the RFP trenches and corresponding P-shield regions, drift layers thickness and doping are designed to keep a sufficiently low electric field at gate trenches and reduce depletion in the P-body region in the OFF state.

Figure 4:
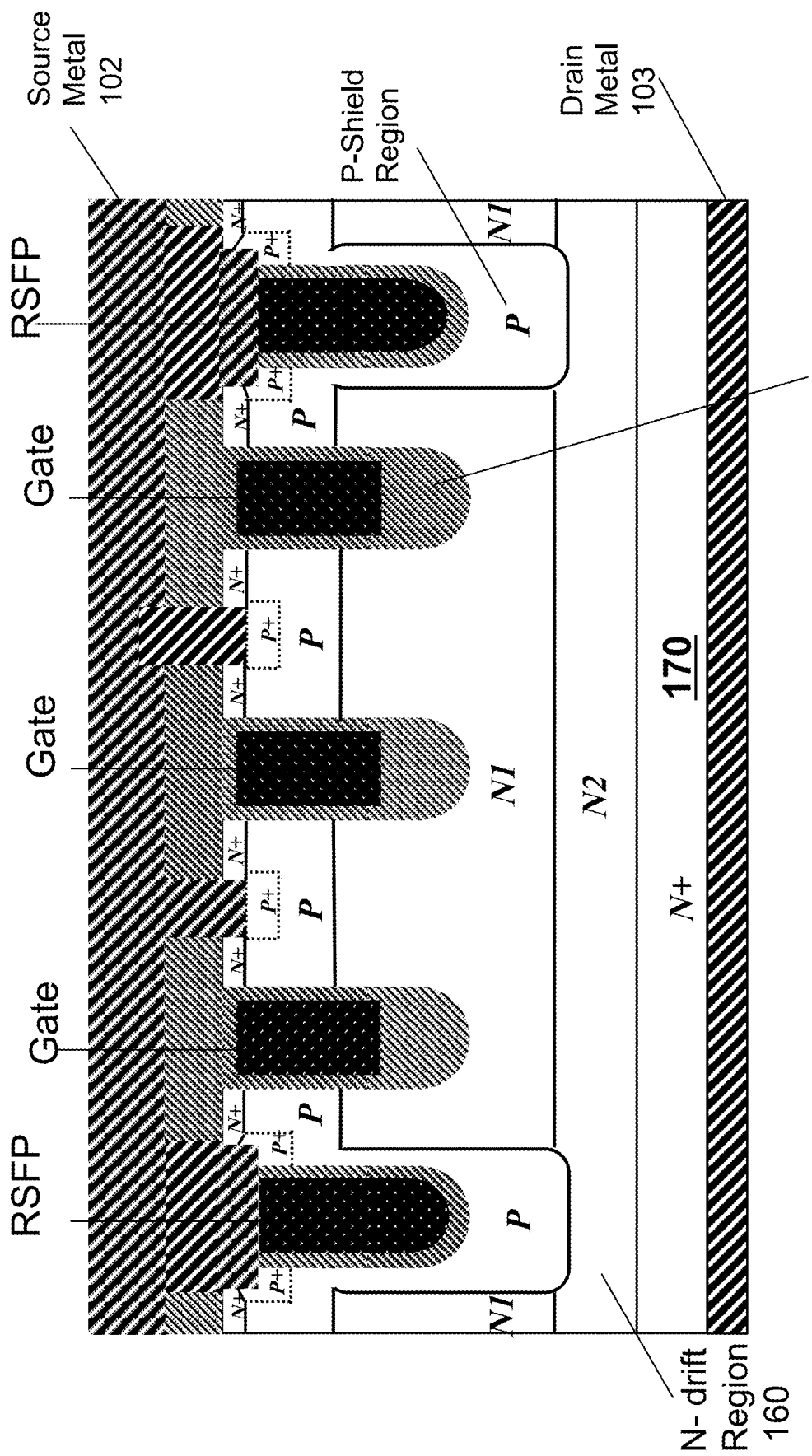
FIG. 4 shows another embodiment similar to that shown in FIG. 3 but with the gate trenches filled with thick bottom oxide.

FIG. 4 shows another embodiment which is generally somewhat similar to that shown in FIG. 3, but with the gate trenches filled with thick bottom oxide to minimize the overlap of the Gate electrode and drain drift region in order to reduce Cgd.

Figure 5A:
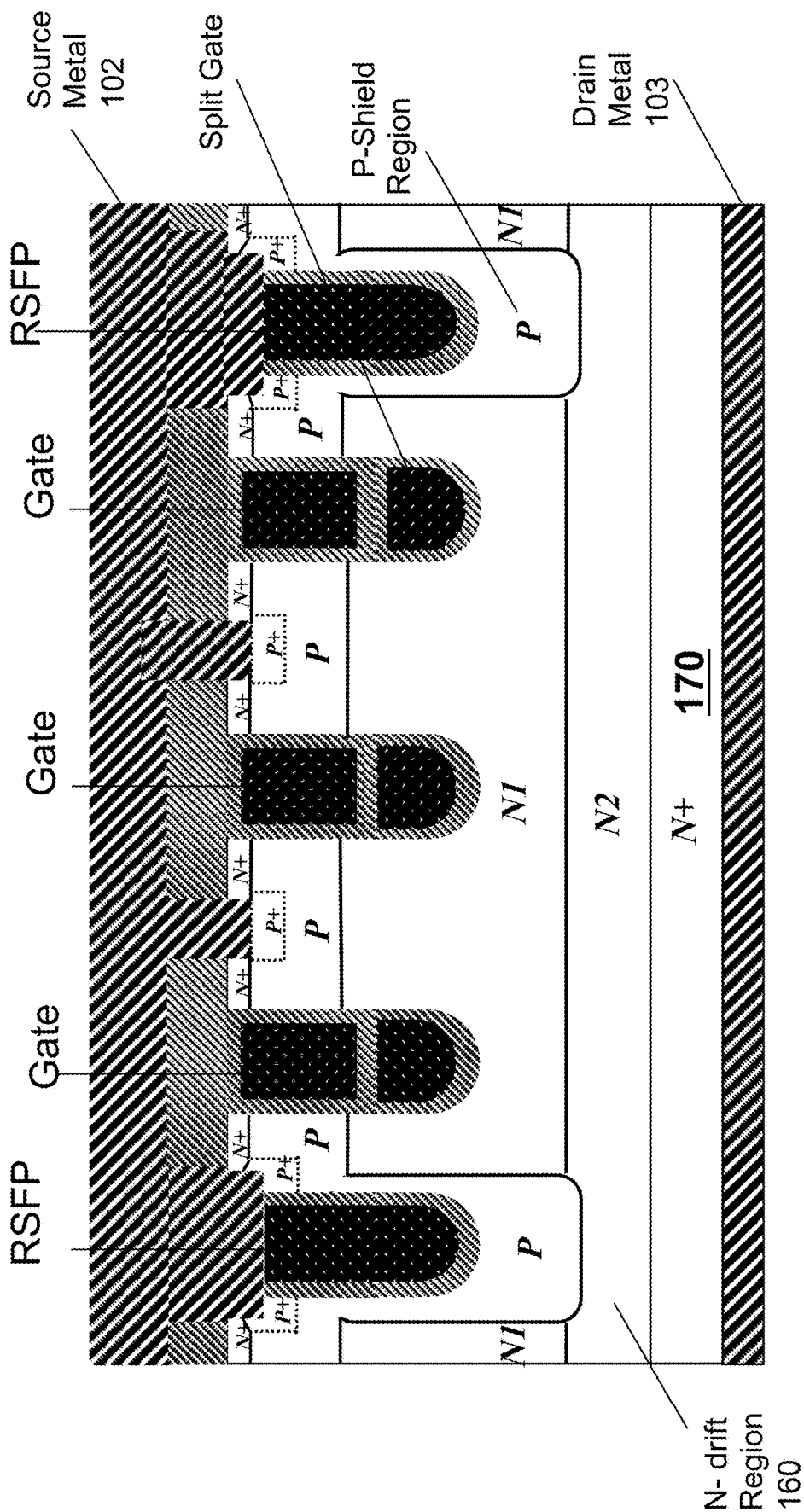
FIG. 5(a) shows another embodiment similar to that shown in FIG. 4 but having a split gate.

FIG. 5(a) shows another embodiment which is generally somewhat similar to that shown in FIG. 4, but having a split gate to reduce Cgd. The split gate is preferably connected to the source terminal (not shown).

Figure 5B:
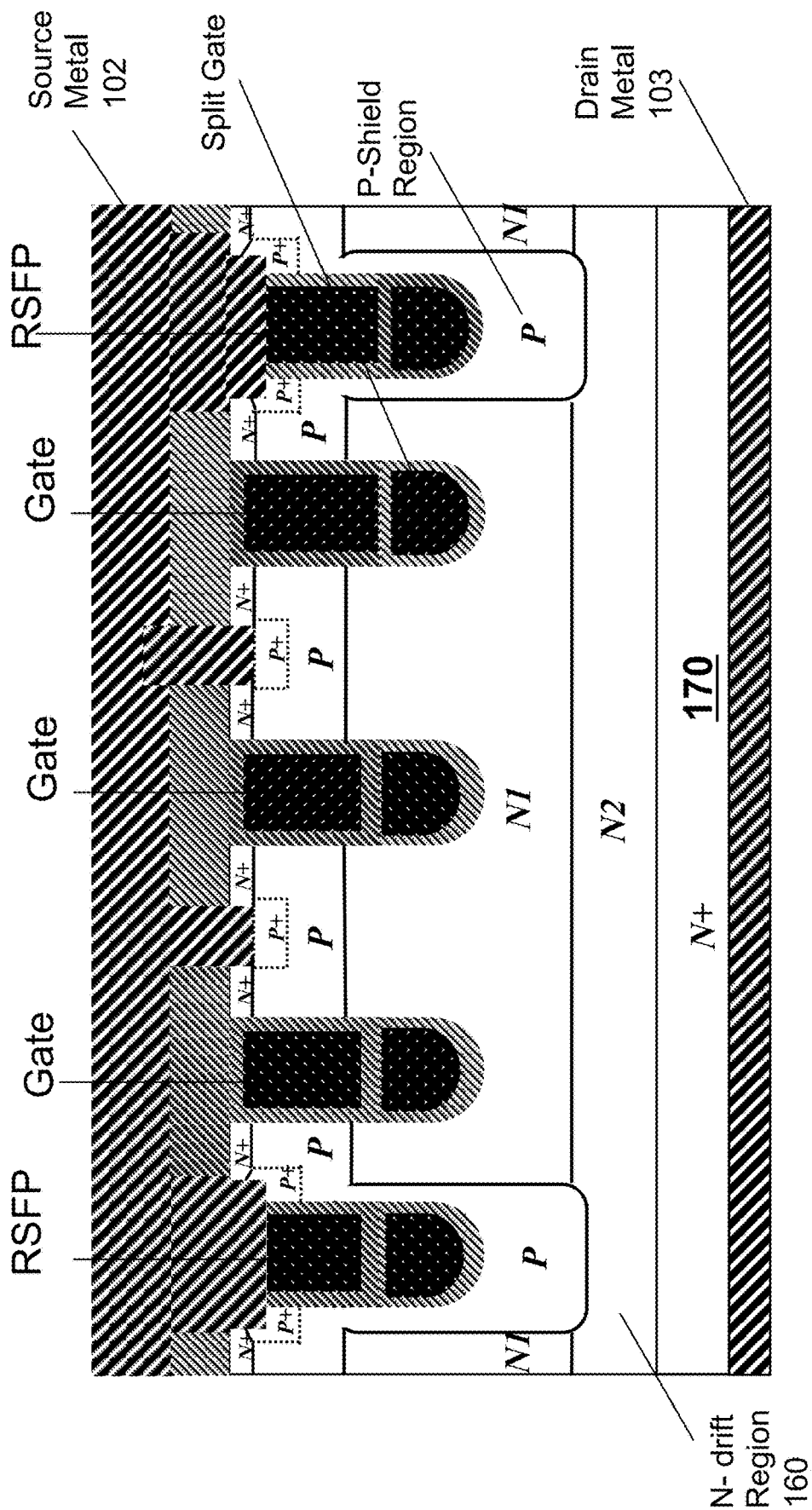
FIG. 5(b) shows another embodiment similar to that shown in FIG. 5(a) but with split electrodes in the RFP trenches.

FIG. 5(b) shows another embodiment which is generally somewhat similar to that shown in FIG. 5(a), but with split electrodes in the RFP trenches.

Figure 6A:
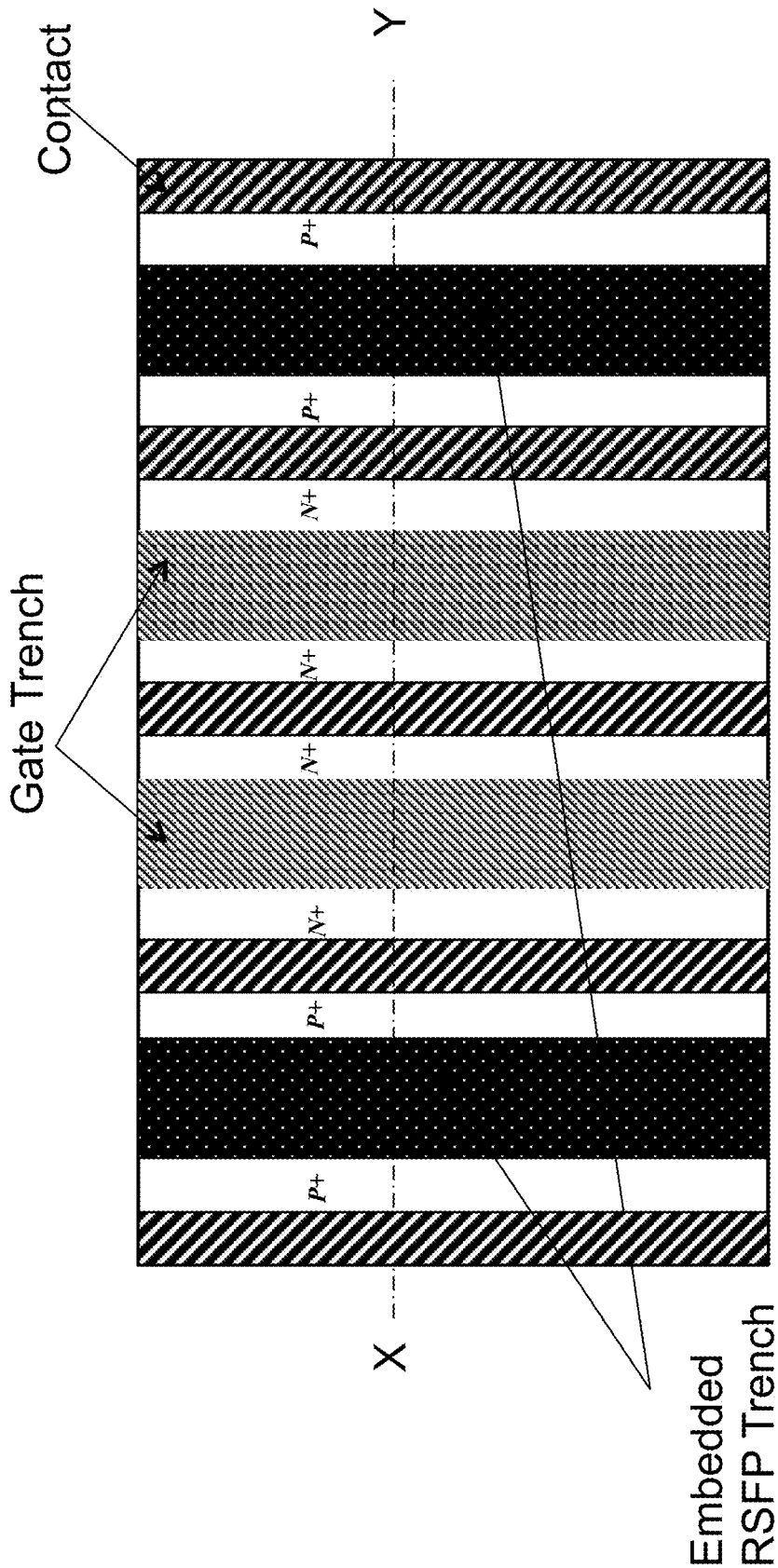
FIG. 6(a) shows a top view schematic layout with two gate electrodes surrounded by embedded RSFP electrodes.
Figure 6B:
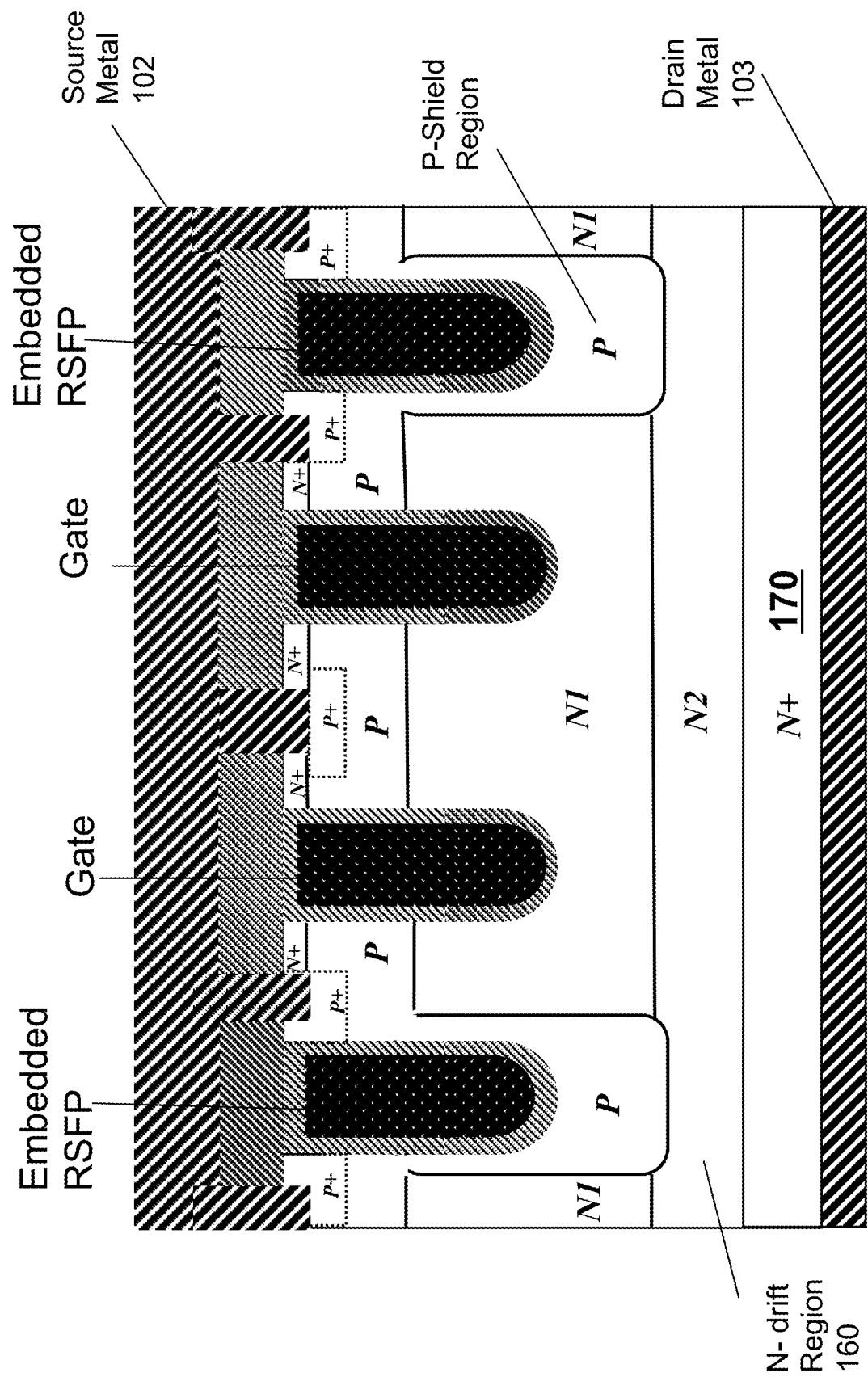
FIG. 6(b), FIG. 6(c) and FIG. 6(d) show various cross sections along the X-Y line in FIG. 6(a).
Figure 6C:
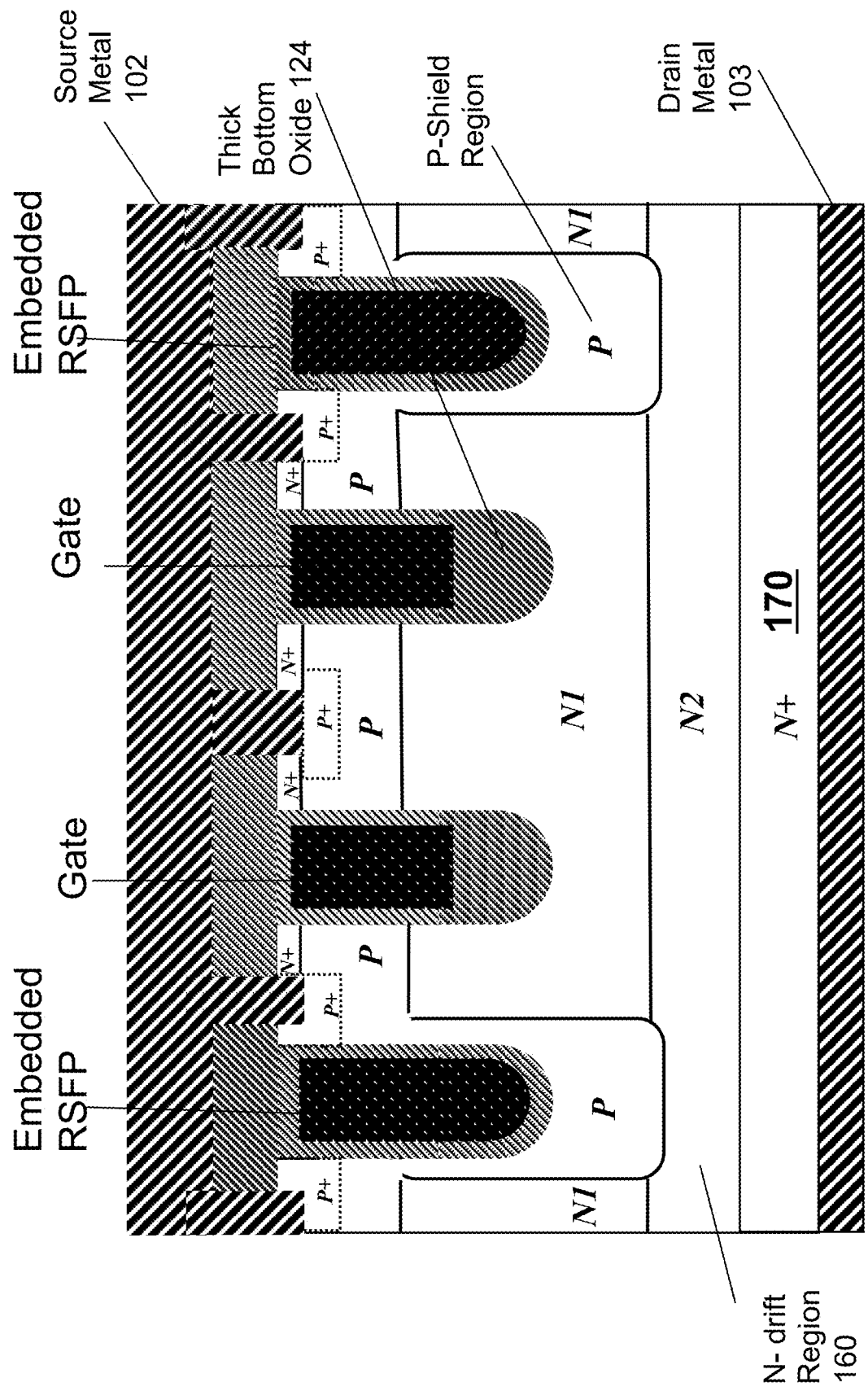
Figure 6D:
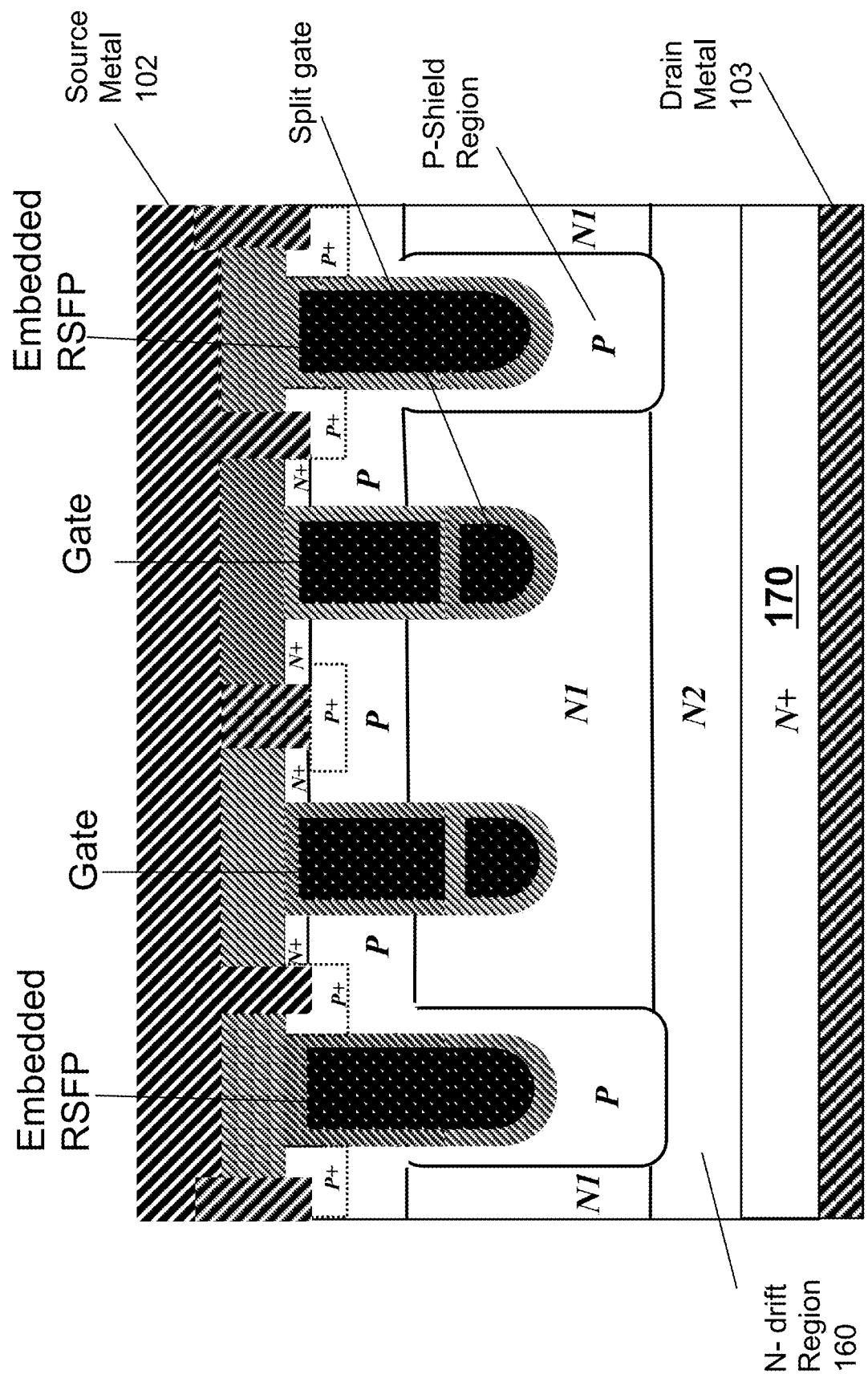

In other embodiments the device structures shown in FIG. 6(a), a top view schematic layout with two gate electrodes surrounded by RSFP electrodes, and FIG. 6(b), FIG. 6(c), and FIG. 6(d) are generally somewhat similar to those shown in FIG. 2, FIG. 4, and FIG. 5(a), but with the RFP electrodes embedded and having a top dielectric material. Furthermore, a different or alternatively a self-aligned metal contact design can be used to increase cell density. The embedded RFP or RSFP electrodes are either independently biased or (more preferably) connected to the source electrode or the gate electrode.

Figure 7A:
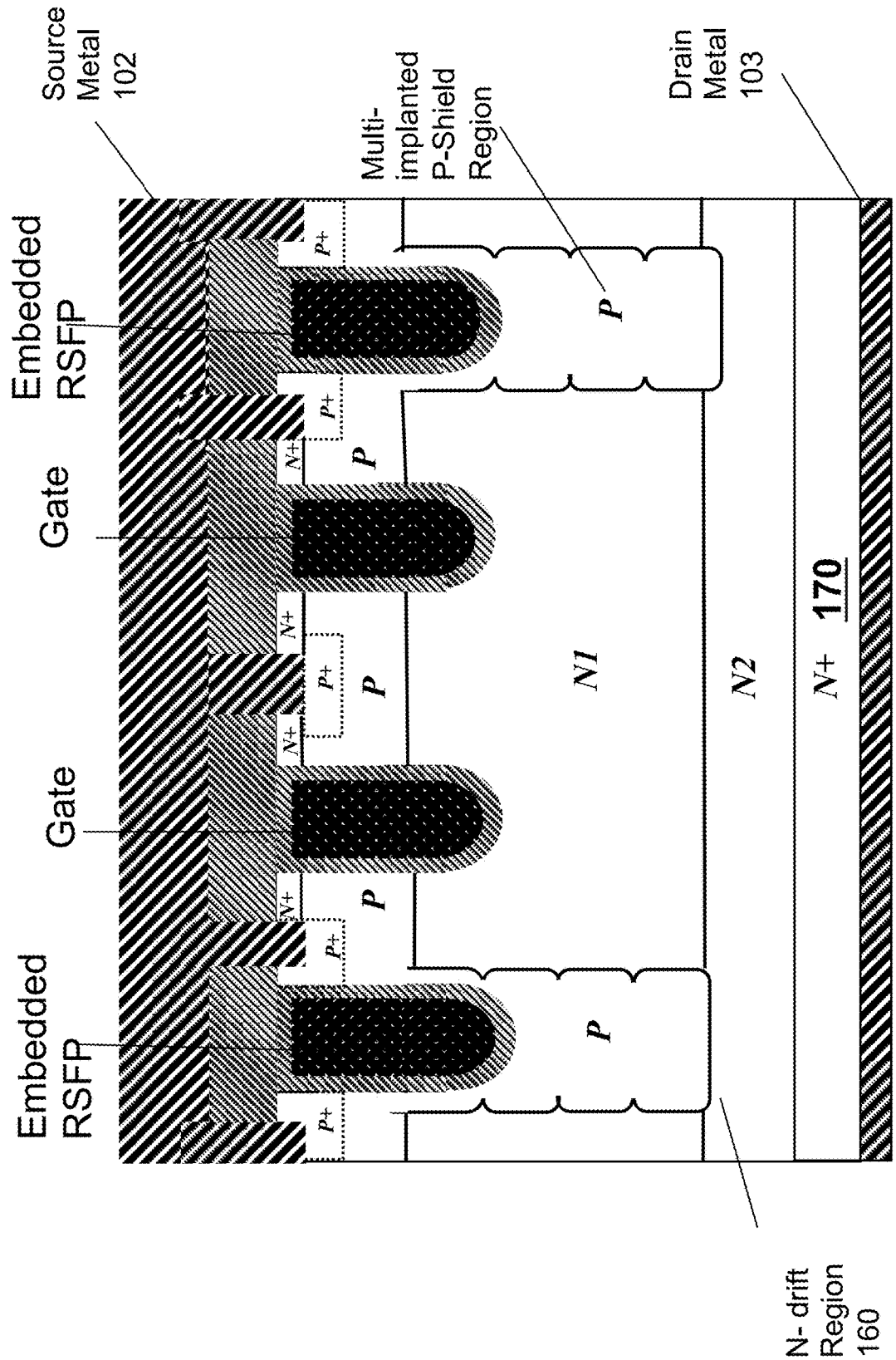
FIG. 7(a) shows an alternative embodiment, in which the shield regions result from multiple implants.

FIG. 7(a) shows an alternative embodiment, in which the shield regions result from multiple implants. In this example the resulting shield extends down to the more lightly doped part of the drain region.

Figure 7B:
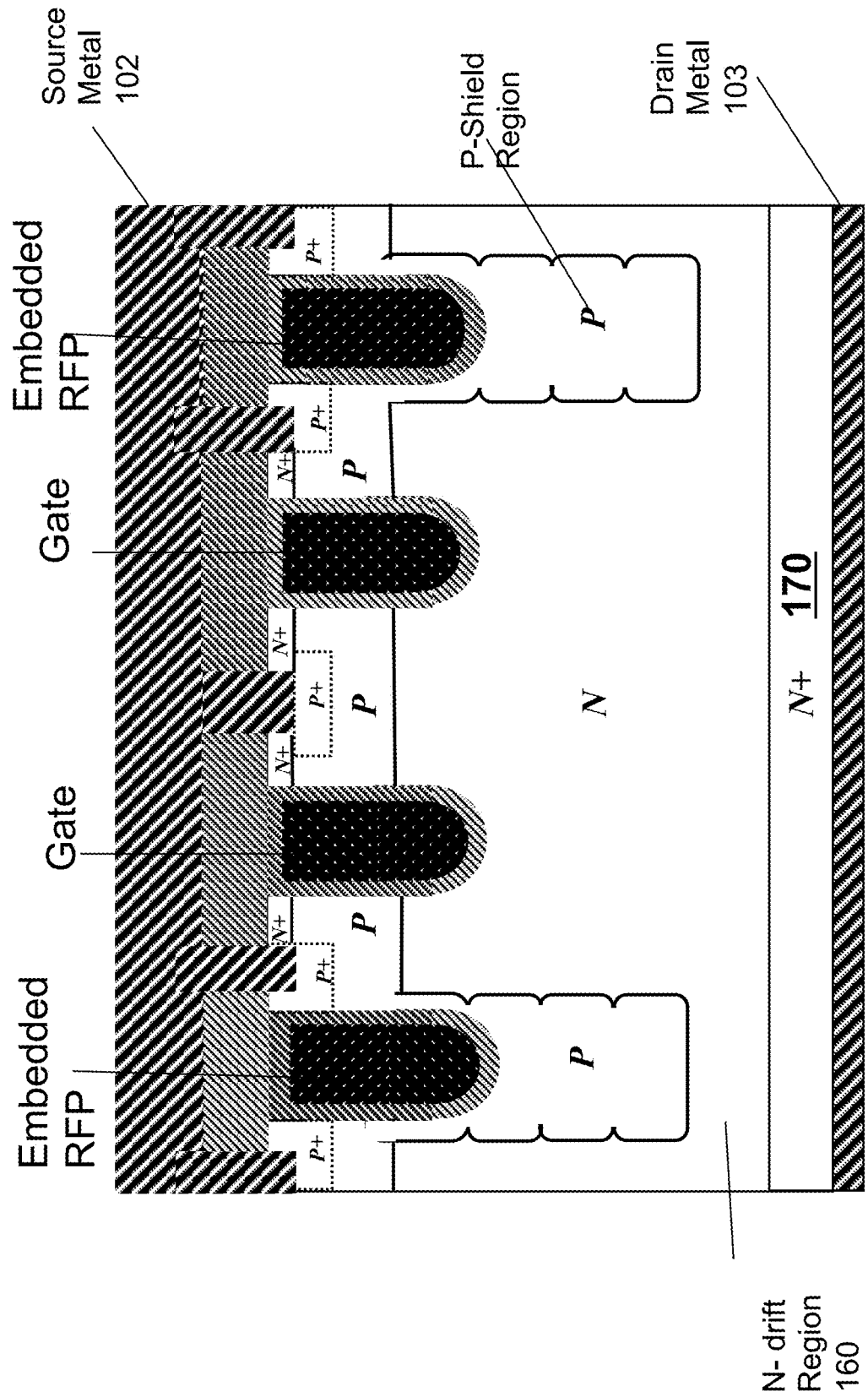
FIG. 7(b) shows another alternative embodiment.

FIG. 7(b) shows another alternative embodiment. Here too the shield region has a profile resulting from multiple implants. However, in this example the drain region does not include the more highly doped portion shown in FIG. 7(a).

Figure 8:
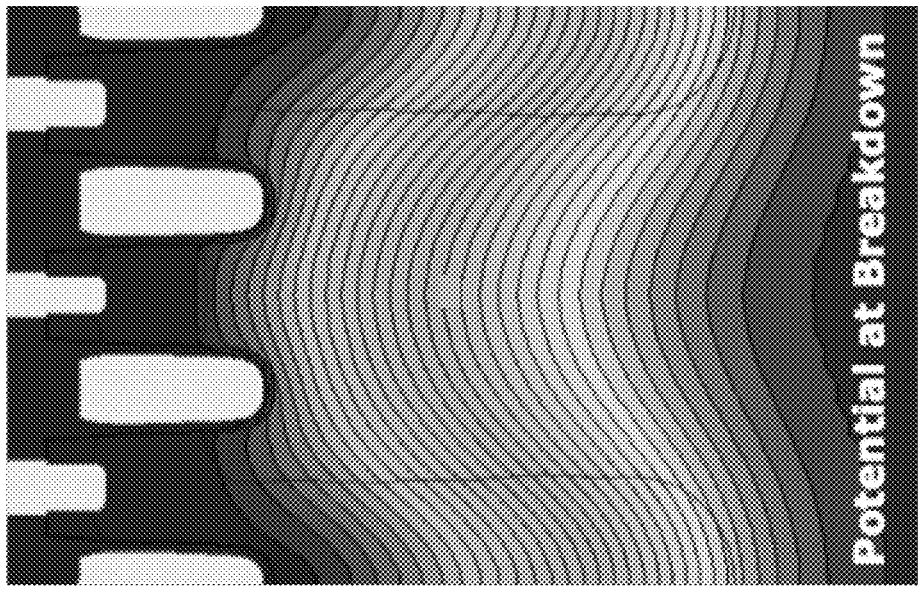
FIG. 8(a) shows the doping profile of a sample embodiment.
FIG. 8(b) diagrammatically shows the electric field (potential contour lines) near breakdown at 65V applied voltage, in the structure of FIG. 8(a).
Figure 8A:
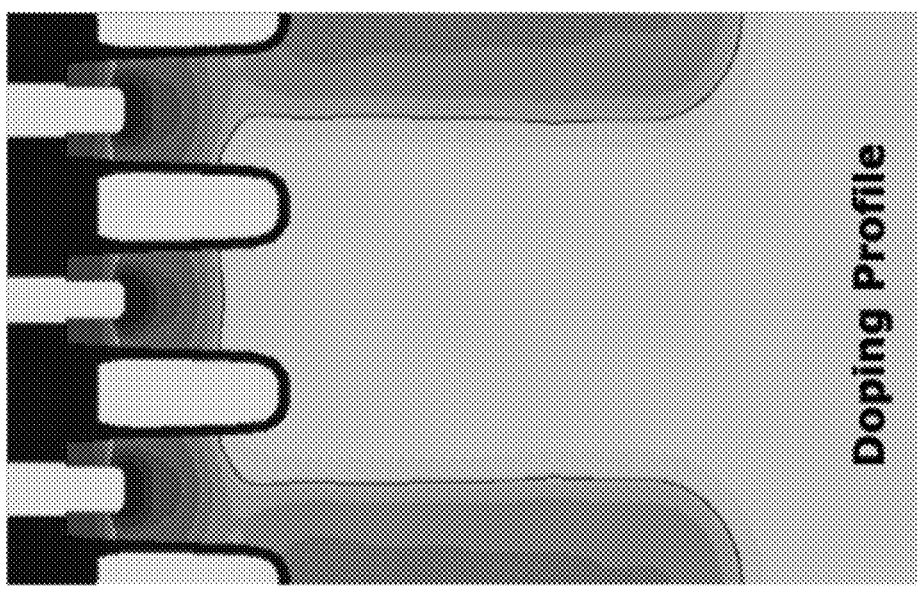

FIG. 8(a) shows the doping profile of a sample embodiment. In this example, there are two parallel gate electrode stripes (shown in cross-section), surrounded by two portions of the recessed field plate electrode. (The two portions, shown in section, can be separate stripes, or can be parts of a single large rectangle (or other closed path), surrounding the gate electrodes.) In this example the epitaxial layer thickness is 6.5 µm and doping is $2.3E16$ $cm^{-3}$, and the p-shield total dose is $3.1E13$ $cm^{-2}$.

FIG. 8(b) diagrammatically shows the electric field (potential contours) near breakdown (at 65V applied voltage in this example), in the structure of FIG. 8(a).

Figure 9B:
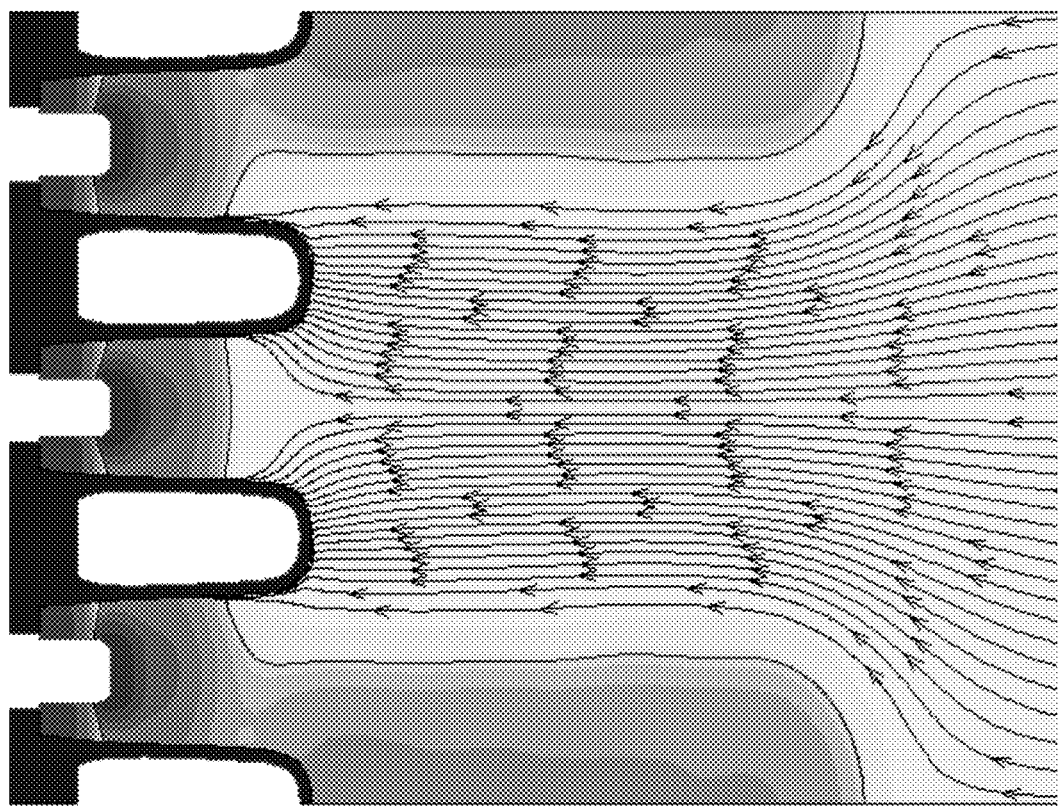
FIG. 9(a) and FIG. 9(b) jointly show a comparison between an example of the innovative structure, in FIG. 9(b), and a previous structure, in FIG. 9(a).
Figure 9A:
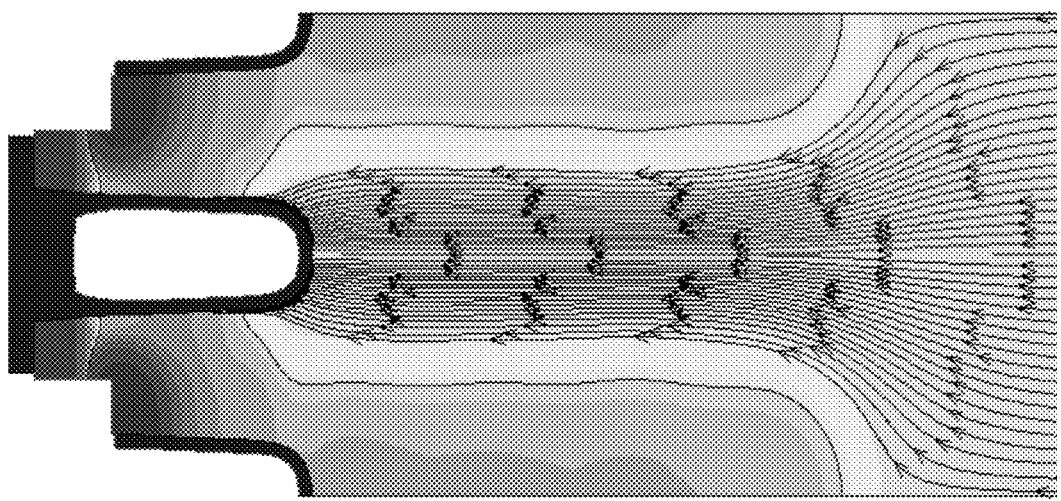

FIG. 9(a) and FIG. 9(b) jointly show a comparison between an example of the innovative structure, in FIG. 9(b), and a previous structure, in FIG. 9(a), which has only one gate electrode stripe surrounded by the trenched recessed field plate. The diagrams shown are current flow-line diagrams; note that the results in FIG. 9(a) show a much higher current density than in FIG. 9(b). This shows that JFET pinch effects are reduced in the structure of FIG. 9(b).

Figure 10A:
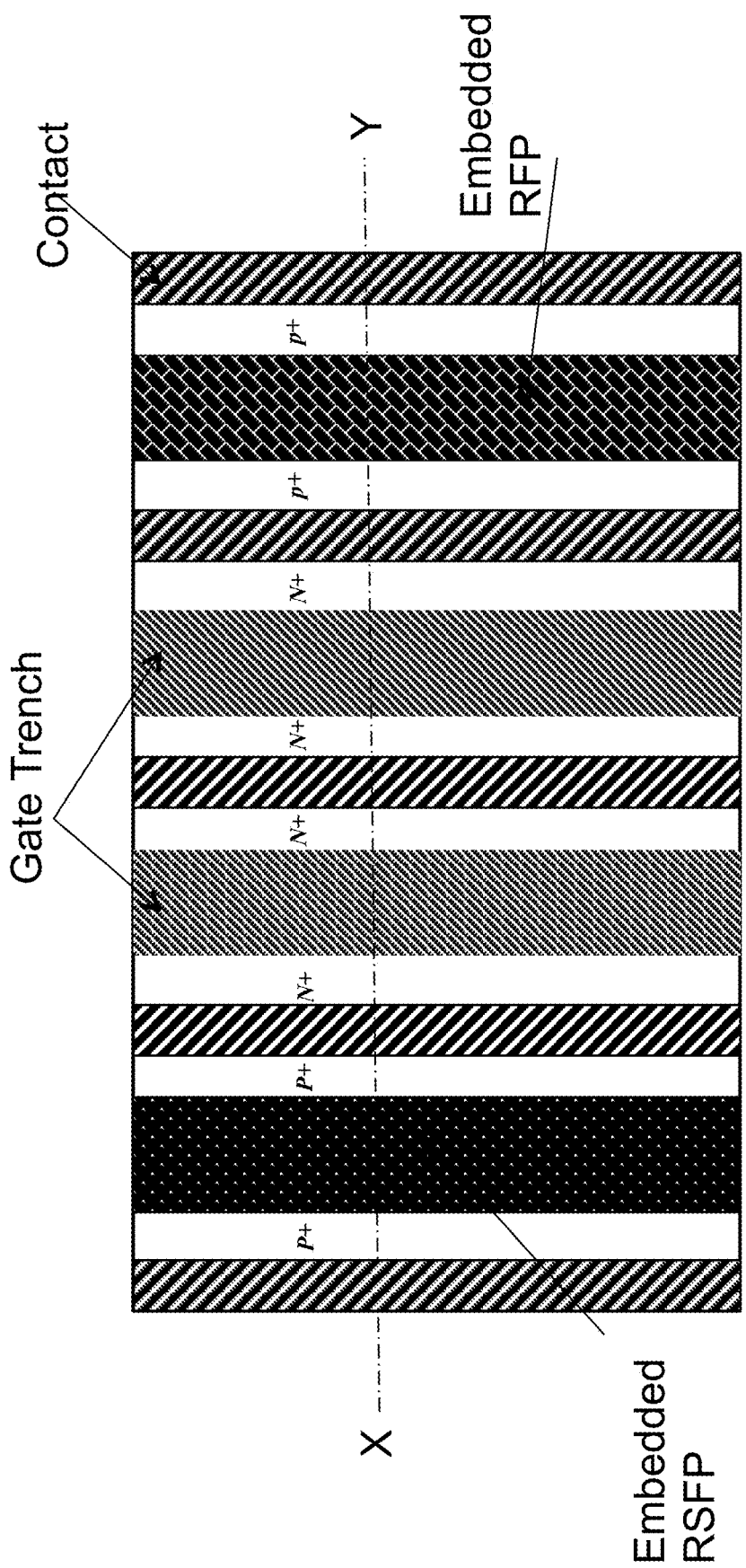
FIG. 10(a) shows a top view of a sample layout for use with the disclosed inventions.

FIG. 10(a) shows a bird's-eye view of a sample layout for use with the disclosed inventions. Two trenched gate electrode stripes 120 are laterally separated (in the layout) only by a stripe of body contact 130. The two stripes 120 are jointly surrounded by the recessed field plate 140. Line X-Y indicates the plane, orthogonal to the surface, where the sectional view of FIG. 10(c) is taken.

Figure 10B:
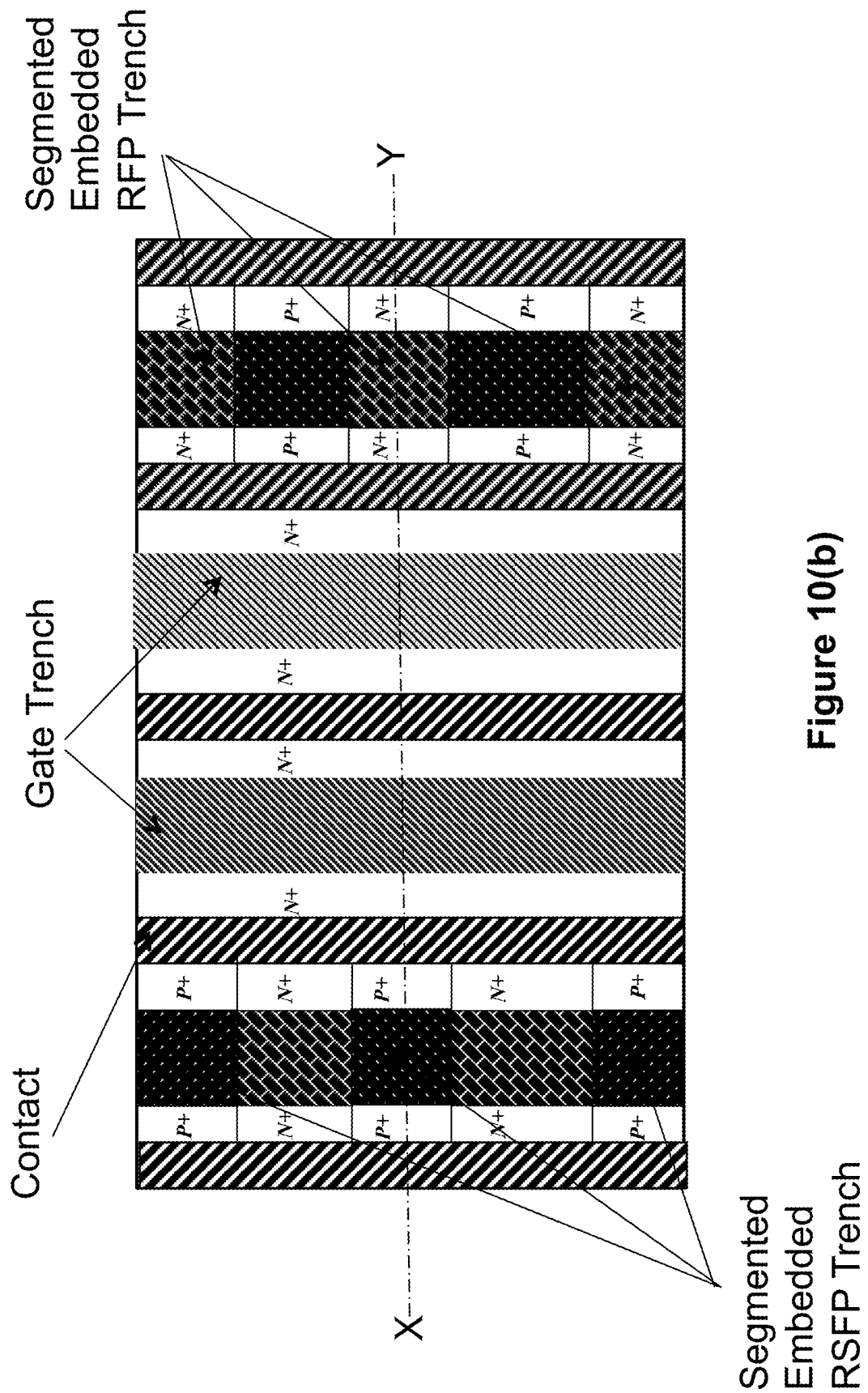
FIG. 10(b) shows a top view of another sample layout for use with the disclosed inventions.
Figure 10C:
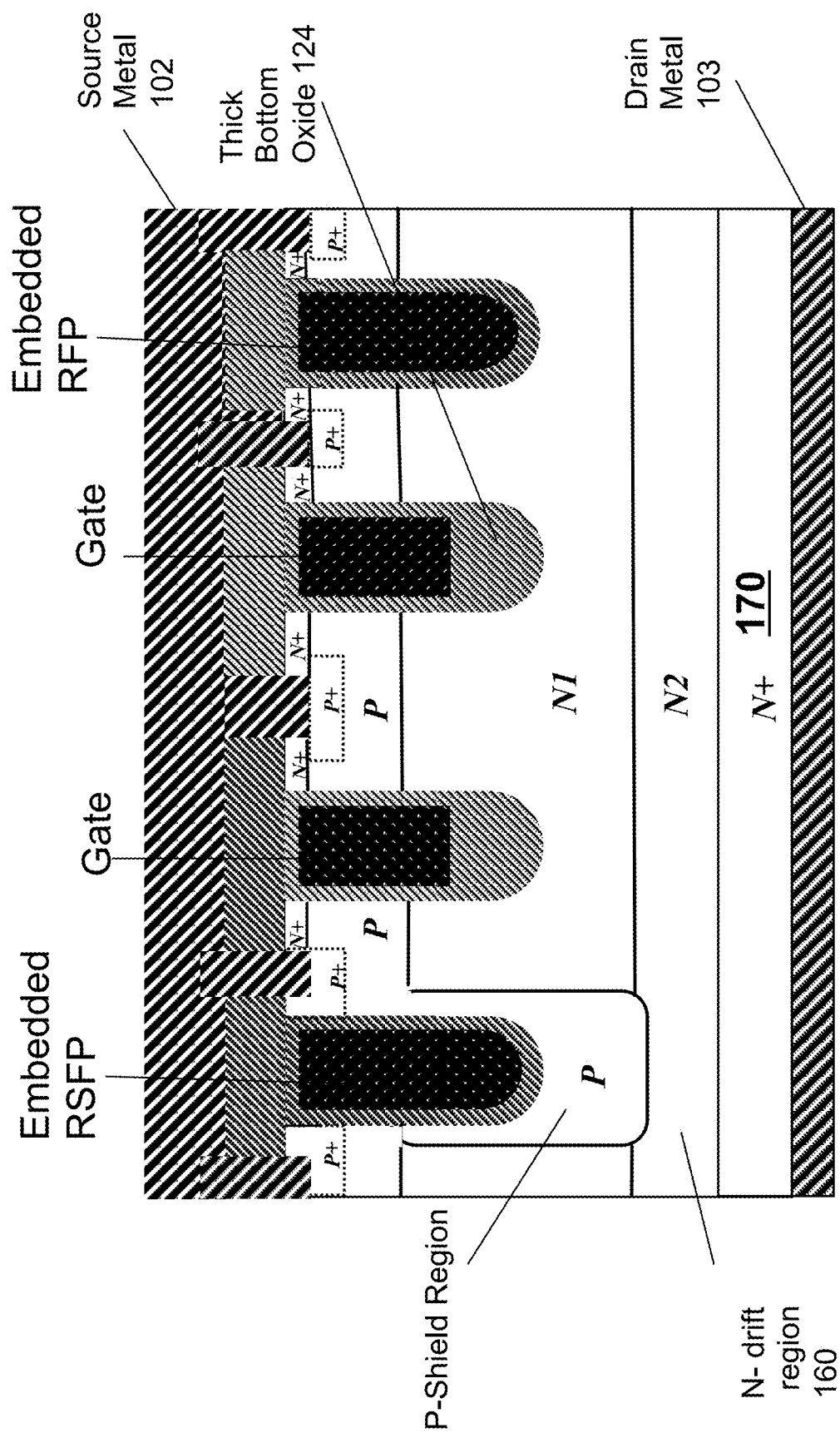
FIG. 10(c) shows examples of innovative structures. The field plate structure on the left is an RSFP, and the field plate structure on the right is an RFP.

FIG. 10(c) shows a comparison of innovative structures. The field plate structure on the left is an RSFP, and the field plate structure on the right is an RFP.

FIG. 10(b) shows a bird's-eye view of another sample layout for use with the disclosed inventions.

Figure 11:
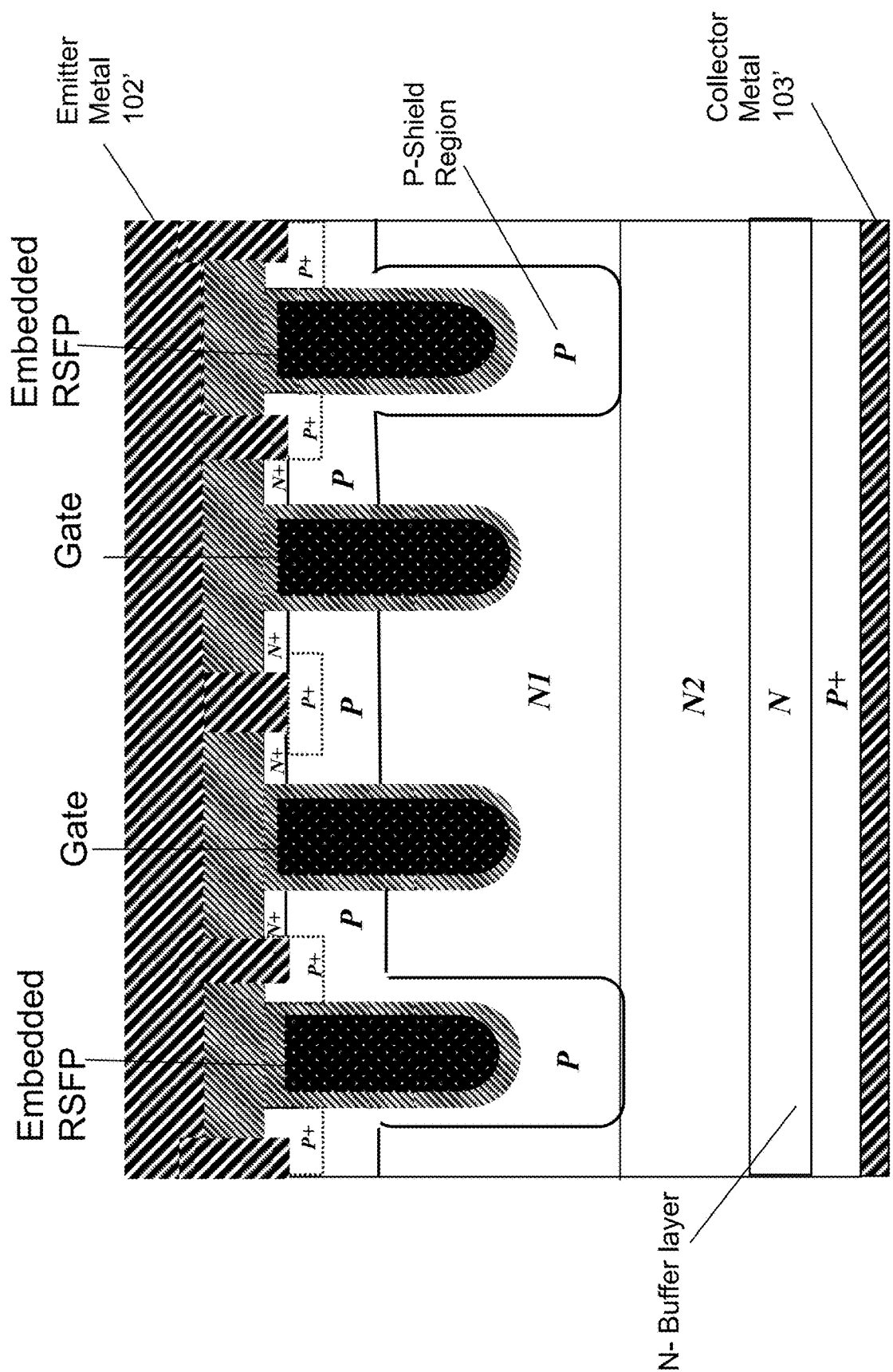
FIG. 11 shows an IGBT which uses several of the innovative ideas described above.

FIG. 11 shows an IGBT which uses several of the innovative ideas described above. The drift region profile is changed, however, to implement some degree of minority carrier generation at the p-n junction below the channel, as is conventional with IGBT devices. Note that the profile of the drift region, in this example, is modified by the addition of an n-type buffer doping layer at the bottom part.

The specific electrical characteristics of devices fabricated using the methods described in this disclosure depend on a number of factors including the thickness of the layers, their doping levels, the materials being used, the geometry of the layout, etc. One of ordinary skill in the art will realize that simulation, experimentation, or a combination thereof can be used to determine the design parameters needed to operate as intended.

While the figures shown in this disclosure are qualitatively correct, the geometries used in practice may differ and should not be considered a limitation in any way. It is understood by those of ordinary skill in the art that the actual layout will vary depending on the specifics of the implementation and any depictions illustrated herein should not be considered a limitation in any way.

The new structures can also be realized using different semiconductor materials such as Silicon, Silicon Carbide, etc.

Advantages

The disclosed innovations, in various embodiments, provide one or more of at least the following advantages. However, not all of these advantages result from every one of the innovations disclosed, and this list of advantages does not limit the various claimed inventions.

Improved efficiency in power conversion systems;
Power semiconductor devices with higher breakdown voltage;
Power semiconductor devices with lower specific on-resistance; and/or
Power semiconductor devices with lower cost for a given voltage and current rating.

According to some but not necessarily all embodiments, there is provided: A semiconductor active device structure comprising: a plurality of gate trenches in a semiconductor substrate, each containing a gate electrode which is insulated from adjacent portions of the substrate, and which is capacitively coupled to adjacent first-conductivity-type channel portion of the substrate; a pair of recessed-field-plate trenches surrounding the plurality of gate trenches; a plurality of second-conductivity-type source regions, positioned in proximity to the gate trenches to emit majority carriers which can pass near the surface of the respective trench; a second-conductivity-type drain region which lies beneath the gate trenches.

According to some but not necessarily all embodiments, there is provided: A semiconductor active device structure comprising: a plurality of gate trenches in a semiconductor substrate, each containing a gate electrode which is insulated from adjacent portions of the substrate, and which is capacitively coupled to an adjacent first-conductivity-type channel portion of the substrate; a pair of recessed-field-plate trenches surrounding two of said gate trenches, so that ones of the gate trenches are adjacent to one of the recessed-field-plate trenches and also to another of the gate trenches; a plurality of second-conductivity-type source diffusions, positioned in proximity to the gate trenches to emit majority carriers which can pass near the surface of the respective trench; a second-conductivity-type drain region which lies beneath the gate trenches.

According to some but not necessarily all embodiments, there is provided: A method for fabricating a semiconductor device, comprising, in any order, the actions of: a) fabricating a plurality of separate gate electrodes; and b) fabricating a recessed field plate structure which surrounds the plurality of separate gate electrodes, but is not interposed between at least some adjacent pairs of gate electrodes.

According to some but not necessarily all embodiments, there is provided: A method for fabricating a semiconductor device, comprising, in any order, the actions of: a) fabricating a plurality of distinguishable trenched gate electrodes within a first-conductivity-type body region which lies above a second-conductivity-type drift region; b) fabricating a recessed field plate structure which laterally surrounds the plurality of gate electrodes, but is not interposed between at least some adjacent pairs of gate electrodes; c) forming a shield region, which generally underlies the recessed field plate structure but not the gate electrodes within the body region; and d) forming an additional second-conductivity-type doping component, within the drift region, which increases the on-state conductivity of the drift region.

According to some but not necessarily all embodiments, there is provided: A semiconductor active device, comprising: a trenched gate electrode in a first layout pattern; a trenched field plate electrode, in a second layout pattern; wherein the layout pattern of the trenched field plate electrode laterally encloses the entire layout pattern of the trenched gate electrode; and wherein portions of said trenched gate electrode laterally adjoin each other without any portion of the trenched field plate electrode intervening.

According to some but not necessarily all embodiments, there is provided: A semiconductor active device, comprising: a trenched gate electrode in a first layout pattern; a trenched field plate electrode, in a second layout pattern; wherein the layout pattern of the trenched field plate electrode laterally encloses the entire layout pattern of the trenched gate electrode; wherein portions of said trenched gate electrode laterally adjoin each other without any portion of the trenched field plate electrode intervening; and a second-conductivity-type source region, positioned in proximity to the trenched gate electrode to emit majority carriers which can pass near the surface of the trenched gate electrode and thence into a second-conductivity-type drift region.

According to some but not necessarily all embodiments, there is provided: A vertical transistor structure in which a recessed field plate trench surrounds multiple adjacent gate electrodes. Thus the specific on-state conductance is increased, since the ratio of recessed field plate area to channel area is reduced. Various versions use two, three, or more separate gate electrodes within the interior of a single RFP or RSFP trench's layout.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

For example, it is also contemplated that, in various alternatives, four or more gate stripes can be laid out in parallel, parallel to or inside the perimeter of a single recessed field plate or recessed shielded field plate trench.

It is also expected that the disclosed inventions can be applied to a semiconductor-on-insulator (SOI) implementation if desired.

It is also contemplated that other compensation regions shape modifications, as shown in other patents and published applications of MaxPower Semiconductor Inc., can also be used to modify the foregoing teachings. For example, without limitation, any of the following, and combinations thereof, can be used, in combination with the knowledge of one of ordinary skill in the art of power semiconductor devices, to teach or suggest appropriate modifications: U.S. Pat. Nos. 7,910,439, 7,911,021, 7,923, 804, 7,960,783, 7,989,293, 8,076,719, 8,304,329, 8,310,001, 8,310,006, 8,310,007, 8,319,278, 8,330,186, 8,330,213, 8,330,214, 8,354,711, 8,378,416, 8,390,060, 8,546,893, 8,564,057, 8,581,341, 8,680,607, 8,704,295, 9,024,379, 9,048,118, 10,062,788, and 10,529,810, all of which are hereby incorporated by reference.

It is also contemplated that a p-type source can be used, with reversal of applied voltage.

It is also contemplated that, as well known to those skilled in the art of power semiconductor devices, thickness/doping changes can be applied to implement different operating voltages.

All the above variants of the structure can be realized in stripe or cellular layout such as square, rectangular, hexagonal or circular layouts.

It should also be understood that numerous combinations of the above embodiments can also be realized.

It also be understood that various semiconductor materials can be used such as Silicon (Si), Silicon Carbide (SiC), or SiGe or other binary or ternary Group IV compound semiconductors. Alternatively but less preferably, the disclosed inventions can be adapted for use with other semiconductor materials, such as III-V compound semiconductors, III-N semiconductors, or others.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is, among others (and, without exclusion, in addition to any other points which are indicated herein as inventive and/or surprising and/or advantageous:

1. A semiconductor active device structure comprising:
   a plurality of gate trenches, comprising two or more gate trenches parallel to each other, in a semiconductor substrate, each containing a gate electrode which is insulated from adjacent portions of the substrate, and which is capacitively coupled to adjacent first-conductivity-type channel portions of the substrate;
   one or more recessed-field-plate trenches laterally surrounding the plurality of gate trenches such that the recessed-field-plate trenches oppose each other with the gate trenches and channel portions between them, the recessed-field-plate trenches containing conductive field plates;
   a plurality of second-conductivity-type source regions, each source region being positioned along opposite sides of each of the gate trenches, in proximity to the gate trenches to emit majority carriers which can pass near the surface of the respective trench and thence into a second-conductivity-type drift region; and
   a second-conductivity type doped drain region which lies beneath the gate trenches and the drift region;
   wherein the plurality of gate trenches have no recessed-field-plate trench between them, such that there are at least two gate trenches between opposing recessed-field-plate trenches,
   wherein the gate trenches and the one or more field plate trenches have substantially the same depth.

2. The device structure of claim 1, wherein the drift region comprises plural layers having separate respective doping concentrations.

3. The device structure of claim 1, wherein each of the source regions is positioned in proximity to both the gate trench and also the recessed-field-plate trench.

4. The device structure of claim 1, wherein the first-conductivity-type is p-type, and the second-conductivity-type is n-type.

5. The device structure of claim 1, further comprising a first-conductivity-type shield region which extends downward from the recessed-field-plate trenches.

6. The device structure of claim 1, wherein the drift region has a vertically graded doping concentration.

7. The device structure of claim 1, wherein the gate trench includes not only the gate electrode, but also an additional conductive electrode which underlies the gate electrode and is insulated from the gate electrode and also from the drift region.

8. The device structure of claim 1, further comprising a first metallization which is operatively connected to the source regions, and a second metallization which is operatively connected to the drain region.

9. The device structure of claim 1, wherein the drift region comprises plural layers having separate respective doping concentrations; and further comprising a first-conductivity type shield region which extends downward from the recessed-field-plate trenches.

10. The device structure of claim 1, further comprising a first-conductivity-type emitter region below said drift region, whereby the active device structure is an IGBT.

11. A semiconductor active device structure comprising:
    a plurality of gate trenches in a semiconductor substrate, each containing a gate electrode which is insulated from adjacent portions of the substrate, and which is capacitively coupled to an adjacent first-conductivity-type channel portion of the substrate;
    a pair of recessed-field-plate trenches surrounding at least two of said gate trenches, so that ones of the gate trenches are opposed to one of the recessed-field-plate trenches and also to another of the gate trenches;
    a plurality of second-conductivity-type source regions, each source region being positioned along opposite sides of each of the gate trenches, positioned in proximity to the gate trenches to emit majority carriers which pass near the surface of the respective trench;
    a second-conductivity-type drain region which lies beneath the gate trenches;
    wherein the at least two of said gate trenches have no recessed-field-plate trench between them, such that there are at least two gate trenches between opposing recessed-field-plate trenches,
    wherein the gate trenches and the field plate trenches have substantially the same depth.

12. The device structure of claim 11, further comprising a drift region between the channel portion and the drain region, wherein the drift region comprises plural layers having separate respective doping concentrations.

13. The device structure of claim 11, wherein each of the source regions is positioned in proximity to both the gate trench and also the recessed-field-plate trench.

14. The device structure of claim 11, wherein the first-conductivity-type is p-type, and the second-conductivity-type is n-type.

15. The device structure of claim 11, further comprising a first-conductivity-type shield region which extends downward from the recessed-field-plate trenches.

16. The device structure of claim 11, further comprising a drift region between the channel portion and the drain region, wherein the drift region has a vertically graded doping concentration.

17. A method for fabricating a semiconductor device, comprising, in any order, the actions of:
  a) fabricating a plurality of distinguishable trenched gate electrodes which each lie within a first-conductivity-type semiconductor body region which lies above a second-conductivity-type drift region, wherein the trenched gate electrodes are within gate trenches;
  b) fabricating a recessed field plate structure which laterally surrounds the plurality of gate electrodes, but is not interposed between at least some adjacent distinguishable pairs of gate electrode portions, wherein the recessed field plate structure is within a field plate trench; and
  c) fabricating a plurality of second-conductivity-type source regions, each source region being positioned along opposite sides of each of the trenched gate electrodes, in proximity to the trenched gate electrodes to emit majority carriers which can pass near the surface of the respective trench and thence into the second conductivity-type drift region,
  wherein the gate trenches and the field plate trench have substantially the same depth.

* * * * *